(12) United States Patent
Kubo et al.

(10) Patent No.: US 11,849,538 B2
(45) Date of Patent: Dec. 19, 2023

(54) COMPOSITE WIRING BOARD, PACKAGE, AND ELECTRONIC DEVICE

(71) Applicants: NGK Electronics Devices, Inc., Mine (JP); NGK Insulators, Ltd., Nagoya (JP); Fujitsu Optical Components Limited, Kawasaki (JP)

(72) Inventors: Noboru Kubo, Shimonoseki (JP); Masato Ishizaki, Sanyo-Onoda (JP); Kento Takahashi, Kawasaki (JP)

(73) Assignees: NGK ELECTRONICS DEVICES, INC., Mine (JP); NGK INSULATORS, LTD., Nagoya (JP); Fujitsu Optical Components Limited, Kawasaki (JP)

( * ) Notice: Subject to any disclaimer, the term of this patent is extended or adjusted under 35 U.S.C. 154(b) by 29 days.

(21) Appl. No.: 17/445,738

(22) Filed: Aug. 24, 2021

(65) Prior Publication Data
US 2022/0151060 A1    May 12, 2022

(30) Foreign Application Priority Data
Nov. 11, 2020   (JP) .................................. 2020-188108

(51) Int. Cl.
*H05K 1/14*      (2006.01)
*H05K 1/02*      (2006.01)
(Continued)

(52) U.S. Cl.
CPC .......... *H05K 1/0245* (2013.01); *G02B 6/4281* (2013.01); *H05K 1/118* (2013.01);
(Continued)

(58) Field of Classification Search
CPC .......... H05K 1/112–116; H05K 1/148; H05K 1/149; H05K 1/189; H05K 1/0245;
(Continued)

(56) References Cited

U.S. PATENT DOCUMENTS 6,040,624 A *  3/2000  Chambers .............. H05K 1/147
                                                    257/668
6,861,899 B2 *  3/2005  Konishi ............... H05K 1/0234
                                                    361/738
(Continued)

FOREIGN PATENT DOCUMENTS

WO     2019/050046 A1     3/2019

*Primary Examiner* — Roshn K Varghese
(74) *Attorney, Agent, or Firm* — BURR PATENT LAW, PLLC

(57) ABSTRACT

A terminal substrate includes a signal terminal disposed on a terminal surface of an insulation ceramic layer. An insulation resin layer of a flexible substrate includes a first surface facing the terminal surface, and a second surface on an opposite side of the first surface. A first signal pad disposed on the first surface is joined to the signal terminal. A first penetration conductive part penetrates the insulation resin layer from the first signal pad. A first signal line is disposed on the second surface. A second penetration conductive part penetrates the insulation resin layer from the first signal line. A second signal line is disposed on the first surface. A third penetration conductive part penetrates the insulation resin layer from the second signal line. A second signal pad is disposed on the second surface.

10 Claims, 12 Drawing Sheets

(51) Int. Cl.
*H05K 1/11* (2006.01)
*G02B 6/42* (2006.01)
*H05K 1/18* (2006.01)

(52) U.S. Cl.
CPC ............... *H05K 1/148* (2013.01); *H05K 1/18* (2013.01); *H05K 2201/09236* (2013.01); *H05K 2201/09481* (2013.01); *H05K 2201/09672* (2013.01); *H05K 2201/2018* (2013.01)

(58) Field of Classification Search
CPC .......... H05K 1/118; H05K 1/18; H05K 1/147; H05K 1/0251; H05K 2201/09263; H05K 2201/09236; H05K 2201/09481; H05K 2201/09672; H05K 2201/2018; H05K 2201/0219; H05K 2201/0154; H05K 2201/09709; H05K 2201/09445; H05K 2201/09427; H05K 3/361; H05K 5/0026; G02B 6/4281
See application file for complete search history.

(56) References Cited

U.S. PATENT DOCUMENTS

| | | | |
|---|---|---|---|
| 7,012,811 B1* | 3/2006 | Jiang | H05K 7/1459 |
| | | | 257/774 |
| 2007/0090852 A1* | 4/2007 | Poux | G01R 31/2805 |
| | | | 324/763.01 |
| 2015/0022288 A1* | 1/2015 | Kato | H01P 3/082 |
| | | | 333/238 |
| 2018/0130718 A1* | 5/2018 | Kawazu | H01L 23/10 |
| 2020/0214130 A1 | 7/2020 | Kawamura et al. | |

* cited by examiner

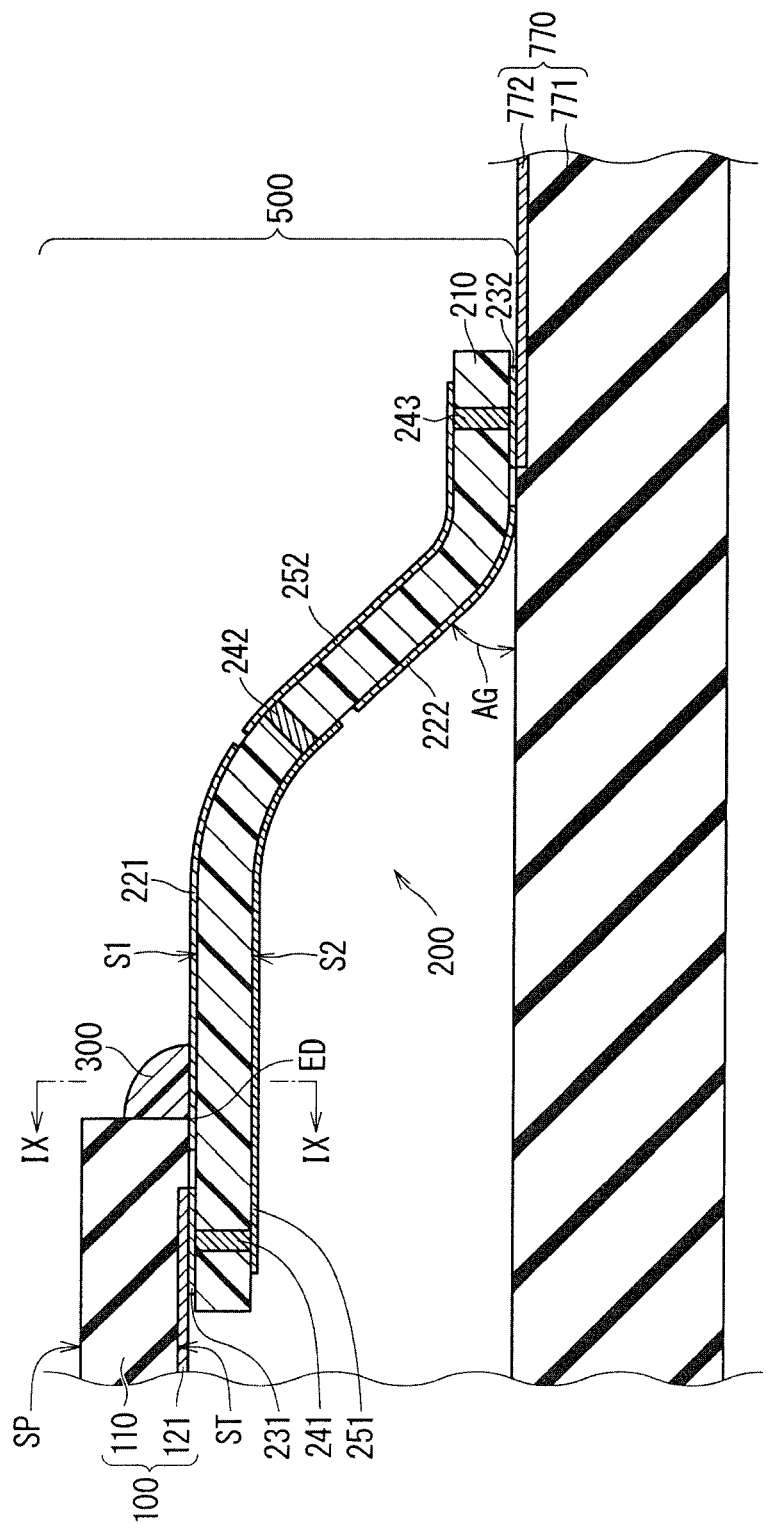
F I G. 6

F I G. 9
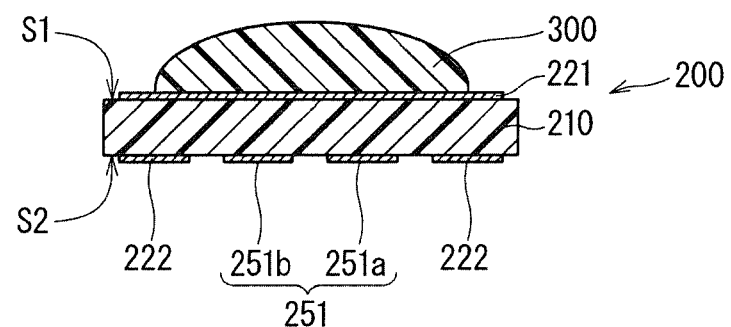

COMPOSITE WIRING BOARD, PACKAGE, AND ELECTRONIC DEVICE

BACKGROUND OF THE INVENTION

Field of the Invention

The present invention relates to a composite wiring board, a package, and an electronic device, and more particularly to a composite wiring board, a package including the composite wiring board, and an electronic device including the package.

Description of the Background Art

In recent years, in the field of electronic devices for information communication, enhancing a bandwidth (that is, enhancing communication speed) and downsizing of an apparatus size have been carried out rapidly. At the same time, low loss transmission of high-frequency signals and smaller sizes have been required for packages that accommodate the electronic device for information communication at a high standard. To meet the requirements, a flexible substrate is in some cases used instead of a metal pin, which is widely used as a high-frequency signal transmission path between the package and its outside. The flexible substrate includes an insulation sheet made of resin having flexibility, and a plurality of metal films attached to a surface of the insulation sheet. In comparison to the metal pin, the metal films can be easily disposed at smaller intervals. Thus, the size of the package can be made smaller.

According to WO 2019/050046, a package for electronic component accommodation is disclosed. According to an example thereof, the package for electronic component accommodation includes a heat dissipation plate, an electronic component mounting part provided on a surface of the heat dissipation plate, a frame part provided to surround the electronic component mounting part, and a connection structure. The connection structure includes a wiring board, and a flexible substrate joined to the wiring board. The wiring board is inserted into the frame part or constitutes a part of the frame part. The wiring board includes an insulation member made of ceramics, a conductive layer for a signal line provided at least on a main surface of the insulation member, and a ground layer provided on a back surface or inside of the insulation member. The flexible substrate includes an insulation sheet made of resin, and a metal film provided at least on a main surface of the insulation sheet. The metal film includes a signal line pad that is provided on the main surface side of the flexible substrate, and that is joined to the conductive layer for a signal line using a joining member.

In manufacture of the electronic device using the package, an electronic component is mounted on the electronic component mounting part of the package. Subsequently, a lid for maintaining an airtight state of a space in the frame part is joined to the opening of the frame part.

The package includes a composite wiring board including the wiring board (terminal substrate) and the flexible substrate. In manufacture of the electronic device, typically, the electronic component is electrically connected to the wiring board, and a printed circuit board (PCB) is joined to the flexible substrate. With this configuration, the electronic component and the PCB are electrically connected to each other by the composite wiring board. Further, in many cases, a heat dissipation plate (base plate) of the package is joined to the top of the PCB. Meanwhile, in a case of an electronic device with a large heat generation amount, such as an optical transmitter, performance of heat dissipation from the base plate is required in particular. Thus, it is conceivable to dispose a lid, instead of the base plate, on the PCB, with the aim of enhancing the heat dissipation performance. Selection of the disposition as above has influence on a configuration of the wiring board (terminal substrate). Specifically, as a result of the selection of the disposition, the positional relationship between the lid and the base plate on which the electronic component is mounted is inversed, and therefore there is a need to dispose the conductive layer for a signal line for electrical connection with the electronic component, specifically, the signal terminal of the terminal substrate, on a surface on the opposite side of the main surface of the insulation member. In this case, the signal terminal of the terminal substrate and the PCB face each other. Thus, the flexible substrate needs to include a signal path between the first surface facing the signal terminal of the terminal substrate and the second surface that is located on the opposite side of the first surface and that faces the PCB (in a more general term, some member). A method of stably enhancing a bandwidth of the above-described signal path of the flexible substrate used in combination with the terminal substrate has not yet been fully studied so far.

SUMMARY

The present invention is made in view of the problem as described above, and has an object to provide a composite wiring board that can stably enhance a bandwidth of a signal path of a flexible substrate electrically joining a signal terminal of a terminal substrate facing a first surface of the flexible substrate and a member facing a second surface of the flexible substrate.

A composite wiring board according to one aspect includes a terminal substrate, and a flexible substrate. The terminal substrate includes an insulation ceramic layer, and a signal terminal. The insulation ceramic layer has a terminal surface having an edge, an opposite surface on an opposite side of the terminal surface, and a side surface connecting the edge of the terminal surface and the opposite surface to each other. The signal terminal is disposed on the terminal surface of the insulation ceramic layer. The flexible substrate includes an insulation resin layer, a first signal pad, a first penetration conductive part, a first signal line, a second penetration conductive part, a second signal line, a third penetration conductive part, and a second signal pad. The insulation resin layer has a first surface facing the terminal surface of the insulation ceramic layer, and a second surface on an opposite side of the first surface. The first signal pad is disposed on the first surface of the insulation resin layer, and is joined to the signal terminal of the terminal substrate. The first penetration conductive part penetrates the insulation resin layer from the first signal pad so as to extend to the second surface of the insulation resin layer. The first signal line is connected to the first signal pad through the first penetration conductive part, and is disposed on the second surface of the insulation resin layer. The second penetration conductive part penetrates the insulation resin layer from the first signal line so as to extend to the first surface of the insulation resin layer. The second signal line is connected to the first signal line through the second penetration conductive part, and is disposed on the first surface of the insulation resin layer so as to be separated away from the first signal pad. The third penetration conductive part penetrates the insulation resin layer from the second signal line so as to extend to the second surface of the insulation resin layer. The second signal pad is connected to the second signal line through the third penetration conductive part, and is disposed on the second surface of insulation resin layer so as to be separated away from the first signal line.

Preferably, the composite wiring board includes a resin adhesive agent connecting the flexible substrate and the side surface of the insulation ceramic layer to each other.

Preferably, the terminal substrate includes a ground terminal disposed on the terminal surface of the insulation ceramic layer, and the flexible substrate includes a first ground pattern disposed on the first surface of the insulation resin layer, and joined to the ground terminal of the terminal substrate, and a second ground pattern disposed on the second surface of the insulation resin layer, and electrically connected to the first ground pattern. Preferably, the terminal surface of the insulation ceramic layer includes a margin region between the edge of the terminal surface and the signal terminal, and the first ground pattern enters a gap between the margin region and the insulation resin layer. Preferably, the second signal line includes an end portion connected to the second penetration conductive part and an extending portion extending from the end portion toward the third penetration conductive part, and an interval between the first ground pattern and the end portion is smaller than an interval between the first ground pattern and the extending portion.

A package according to one aspect includes the composite wiring board, and a frame part constituting a space for accommodating an electronic component, together with the terminal substrate. Preferably, the package includes a base plate for supporting the electronic component. The base plate faces the opposite surface of the terminal substrate.

An electronic device according to one aspect includes the package, the electronic component, and a circuit substrate. The electronic component is supported by the base plate of the package, and is electrically connected to the signal terminal of the package. The circuit substrate includes a circuit joined to the second signal pad of the package.

According to one aspect, a member (typically, a PCB) to be joined to the second signal pad of the flexible substrate faces the second surface, not the first surface, of the flexible substrate, while the signal terminal of the terminal substrate faces the first surface of the flexible substrate. In the composite wiring board, primarily, with a signal path of the flexible substrate being guided to the second surface of the flexible substrate by the first penetration conductive part, adverse influence on characteristic impedance of the signal path due to a configuration near the terminal substrate faced by the first surface can be reduced. Secondarily, with the signal path of the flexible substrate being guided to the first surface of the flexible substrate by the second penetration conductive part, adverse influence on characteristic impedance of the signal path due to a configuration near the member faced by the second surface can be reduced. Based on these advantages, both of the adverse influence on characteristic impedance of the signal path due to the configuration near the terminal substrate faced by the first surface and the adverse influence on characteristic impedance of the signal path due to the configuration near the member faced by the second surface can be reduced. With this configuration, characteristic impedance of the signal path of the flexible substrate can be more easily maintained at a desired value. From the above, it is possible to stably enhance a bandwidth of the signal path of the flexible substrate electrically joining the signal terminal of the terminal substrate facing the first surface of the flexible substrate and the member facing the second surface of the flexible substrate to each other.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 6 is an enlarged view of a region VI illustrated in FIG. 1.

FIG. 9 is a cross-sectional diagram schematically illustrating a configuration of the flexible substrate and a resin adhesive agent taken along the line IX-IX of FIG. 6.

DESCRIPTION OF THE PREFERRED EMBODIMENTS

An embodiment of the present invention will be described below with reference to the drawings. Note that, in the following description, terms related to directions, such as "up", "down", "right", "left", and "bottom", are used. Unless otherwise specifically noted, however, these terms are used to distinguish directions, and are not to indicate relation to the gravity direction. Specifically, unless otherwise specifically noted, the orientation of each configuration described in the following description with reference to the gravity direction is arbitrary.

Figure 1:
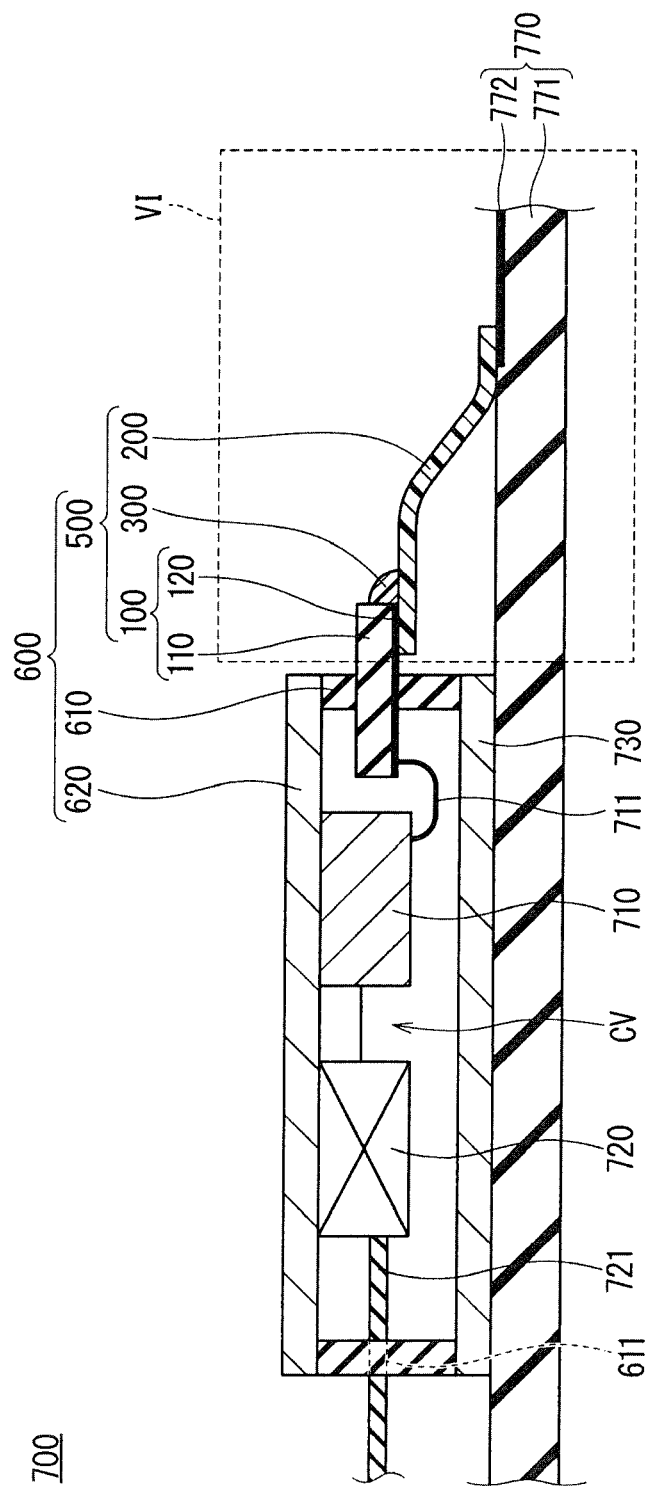
FIG. 1 is a cross-sectional diagram schematically illustrating a configuration of an electronic device according to an embodiment.
Figure 2:
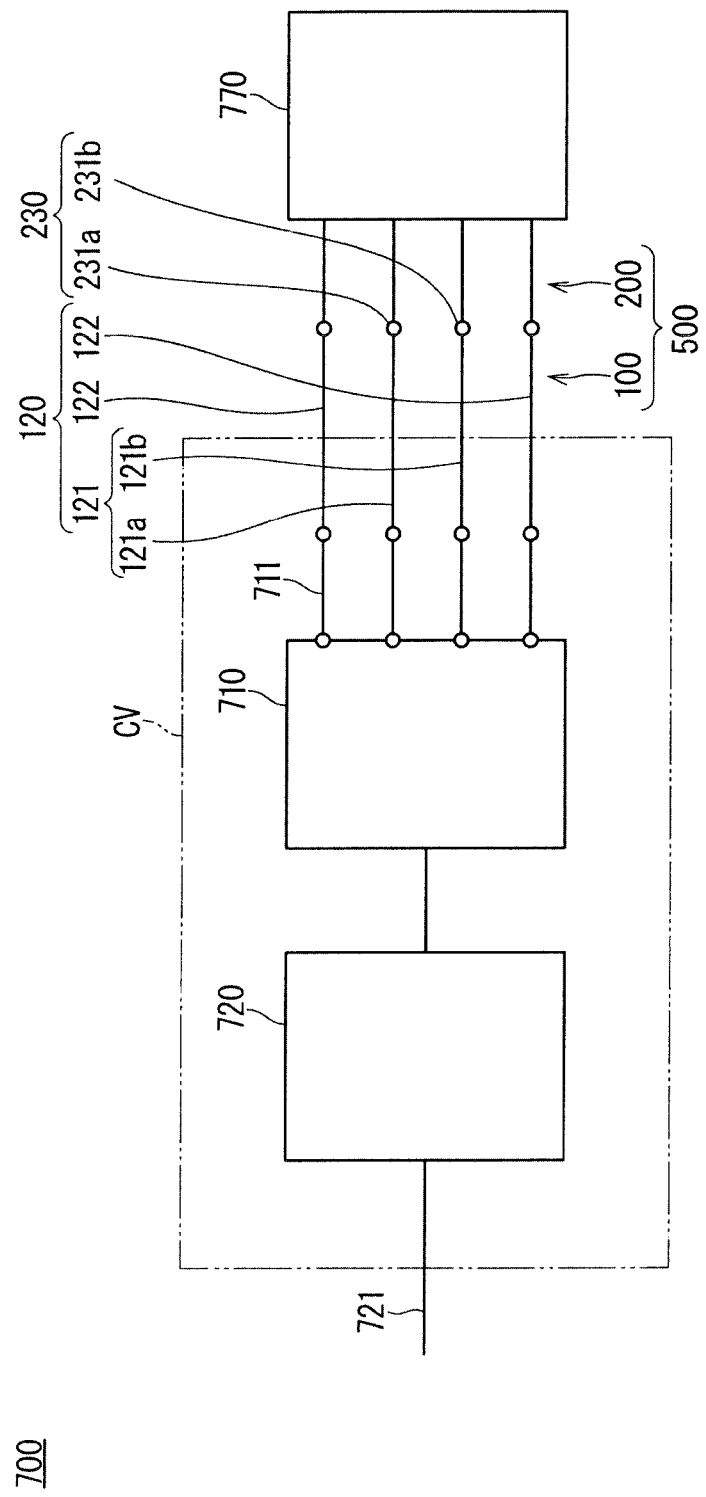
FIG. 2 is a block diagram schematically illustrating a configuration of the electronic device illustrated in FIG. 1.

FIG. 1 and FIG. 2 are a cross-sectional diagram and a block diagram, respectively, schematically illustrating a configuration of an electronic device 700 according to an embodiment. The electronic device 700 includes a package 600 (package with a flexible substrate), an electronic component 710, a bonding wire 711 (electrical connection member), an optical component 720, an optical fiber 721 (light transmission path), a lid 730, and a PCB 770 (circuit substrate). In the present embodiment, the electronic device 700 is an optical transmission apparatus, and is, for example, an optical transmitter, an optical receiver, or an optical transmitter/receiver. The optical component 720 and the electronic component 710 are electrically connected to each other. The electronic component 710 is, typically, a semiconductor device such as an integrated circuit (IC). The optical component 720 is, for example, a photodiode or a semiconductor laser. The optical component 720 is optically connected to the optical fiber 721. The PCB 770 includes an insulation layer 771, and a circuit 772 (metal pattern) that is provided on the insulation layer 771. The circuit 772 of the PCB 770 is electrically connected to the electronic component 710 through the package 600 and the bonding wire 711.

Figure 3:
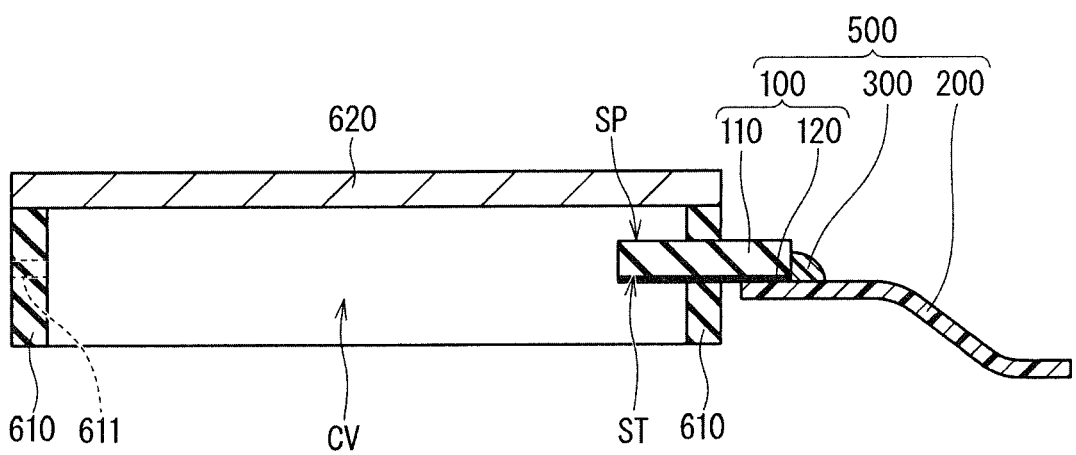
FIG. 3 is a cross-sectional diagram schematically illustrating a configuration of a package included in the electronic device illustrated in FIG. 1.

FIG. 3 is a cross-sectional diagram schematically illustrating a configuration of the package 600 included in the electronic device 700 (FIG. 1). The package 600 includes a composite wiring board 500, a frame part 610, and a base plate 620. The composite wiring board 500 includes a terminal substrate 100 and a flexible substrate 200.

The terminal substrate 100 and the frame part 610 constitute a cavity CV (space) for accommodating the electronic component 710 (FIG. 1). The cavity CV is a space that is surrounded by the terminal substrate 100 and the frame part 610. In the package 600 (FIG. 3), the cavity CV includes a side wall surface configured by the terminal substrate 100 and the frame part 610, and a bottom surface configured by the base plate 620. The terminal substrate 100 includes an insulation ceramic layer 110, and a plurality of terminals 120 made of a conductive material. Note that fine insulator particles may be distributed in the conductive material.

The base plate 620 is provided to support the electronic component 710, and supports the electronic component 710 in the electronic device 700 (FIG. 1). The base plate 620 has a function as a heat dissipation plate as well as a function as a support plate. It is preferable that the base plate 620 be made of metal.

In the example illustrated in FIG. 3, the frame part 610 includes a through hole portion 611 for allowing the optical fiber 721 (FIG. 1) to pass through. As a modification, a light blocking portion may be provided instead of the through hole portion 611. The light blocking portion is a window portion made of a light blocking material.

Figure 4:
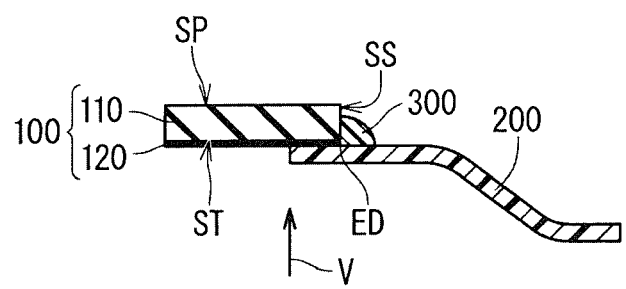
FIG. 4 is a cross-sectional diagram schematically illustrating a configuration of a composite wiring board included in the package illustrated in FIG. 3.
Figure 5:
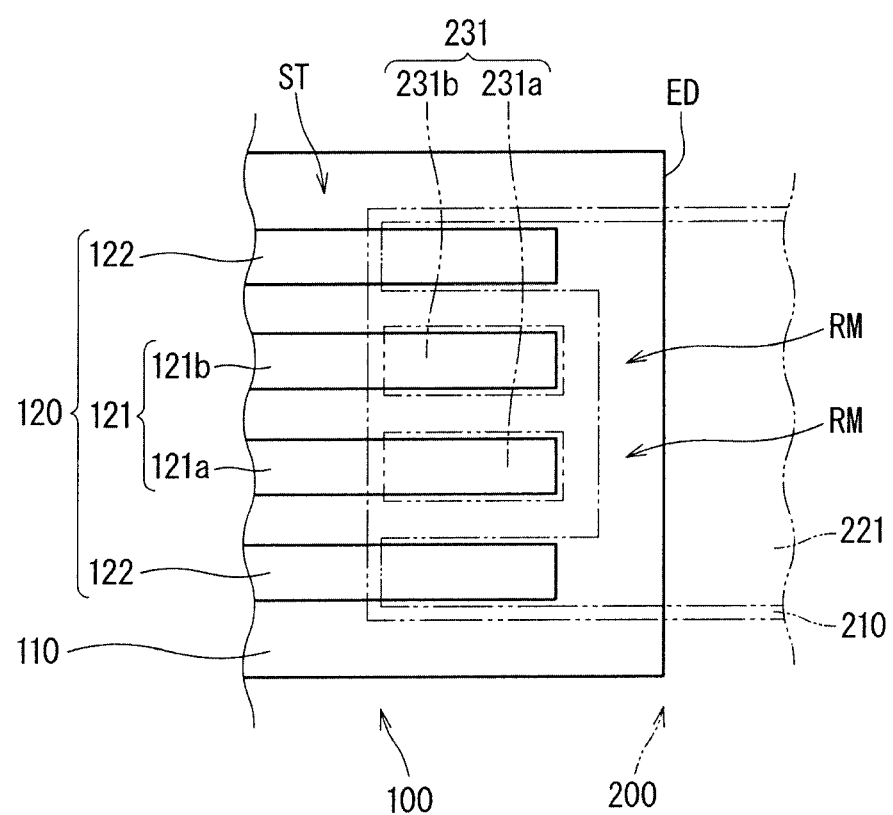
FIG. 5 is a plan view schematically illustrating a terminal substrate and a flexible substrate with a solid line and a two-dot chain line, respectively, as seen in the direction of the arrow V of FIG. 4.

FIG. 4 is a cross-sectional diagram schematically illustrating a configuration of the composite wiring board 500 included in the package 600 (FIG. 3). Note that, in FIG. 1, FIG. 3, and FIG. 4, illustration of conductive members included in the flexible substrate 200 is omitted. FIG. 5 is a plan view schematically illustrating each of the terminal substrate 100 and the flexible substrate 200 with a solid line and an imaginary line, respectively, as seen in the direction of the arrow V (FIG. 4).

The insulation ceramic layer 110 of the terminal substrate 100 includes a terminal surface ST including an edge ED (lower surface in FIG. 4), an opposite surface SP on the opposite side of the terminal surface ST (upper surface in FIG. 4), and a side surface SS that connects the edge ED of the terminal surface ST and the opposite surface SP to each other (right surface in FIG. 4). In the package 600 (FIG. 3), the base plate 620 faces the opposite surface SP of the terminal substrate 100.

It is preferable that the composite wiring board 500 include a resin adhesive agent 300. The resin adhesive agent 300 connects the flexible substrate 200 and the side surface SS of the insulation ceramic layer 110 to each other.

The plurality of terminals 120 of the terminal substrate 100 are disposed on the terminal surface ST of the insulation ceramic layer 110. The plurality of terminals 120 include a plurality of signal terminals 121 and ground terminals 122. The signal terminals 121 (FIG. 5) include a signal terminal 121a and a signal terminal 121b as a pair of signal terminals constituting one differential line in the terminal surface ST of the insulation ceramic layer 110. The ground terminals 122 are disposed to two-dimensionally shield the differential line. In the electronic device 700 (FIG. 1 and FIG. 2), the electronic component 710 is electrically connected to each of the signal terminals 121 and the ground terminals 122 through the bonding wire 711. Thus, the electronic component 710 is electrically connected to the signal terminals 121 and the ground terminals 122.

Figure 7:
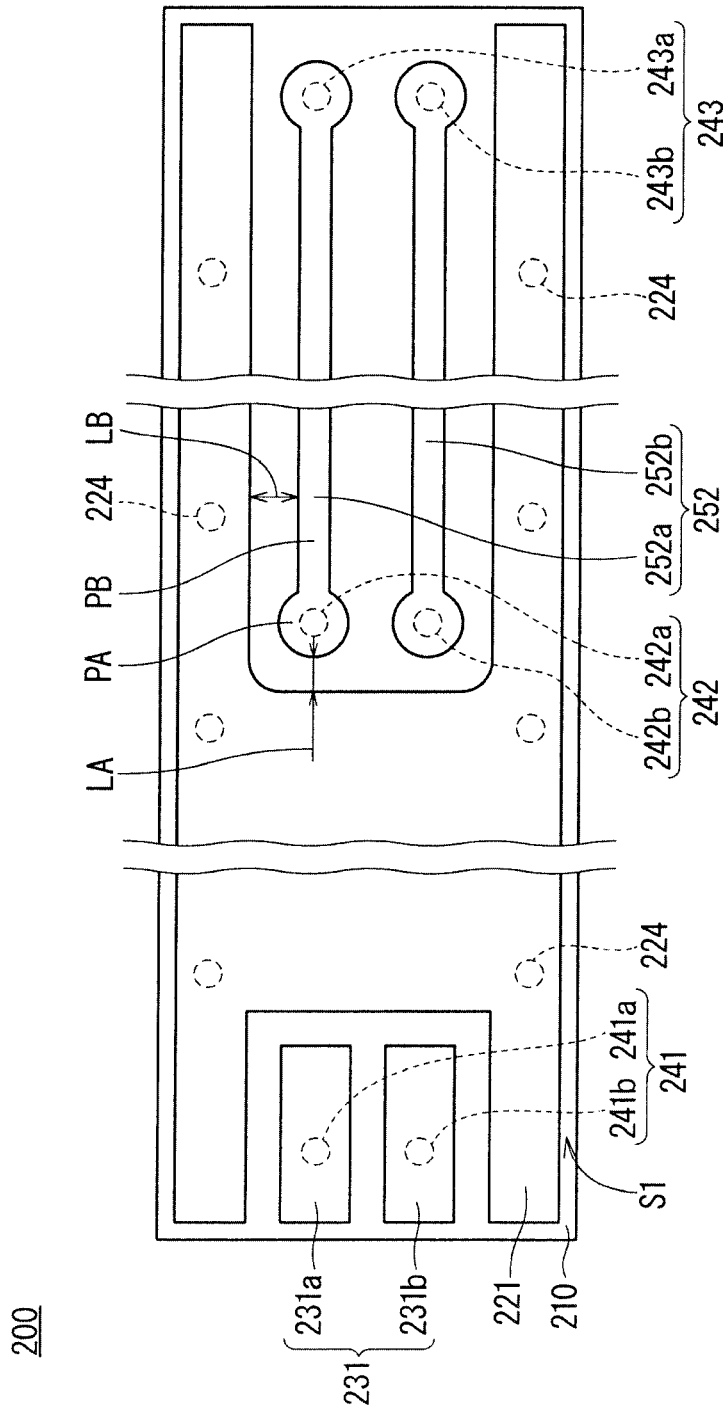
FIG. 7 is a top view schematically illustrating a configuration of the flexible substrate included in the electronic device illustrated in FIG. 6.
Figure 8:
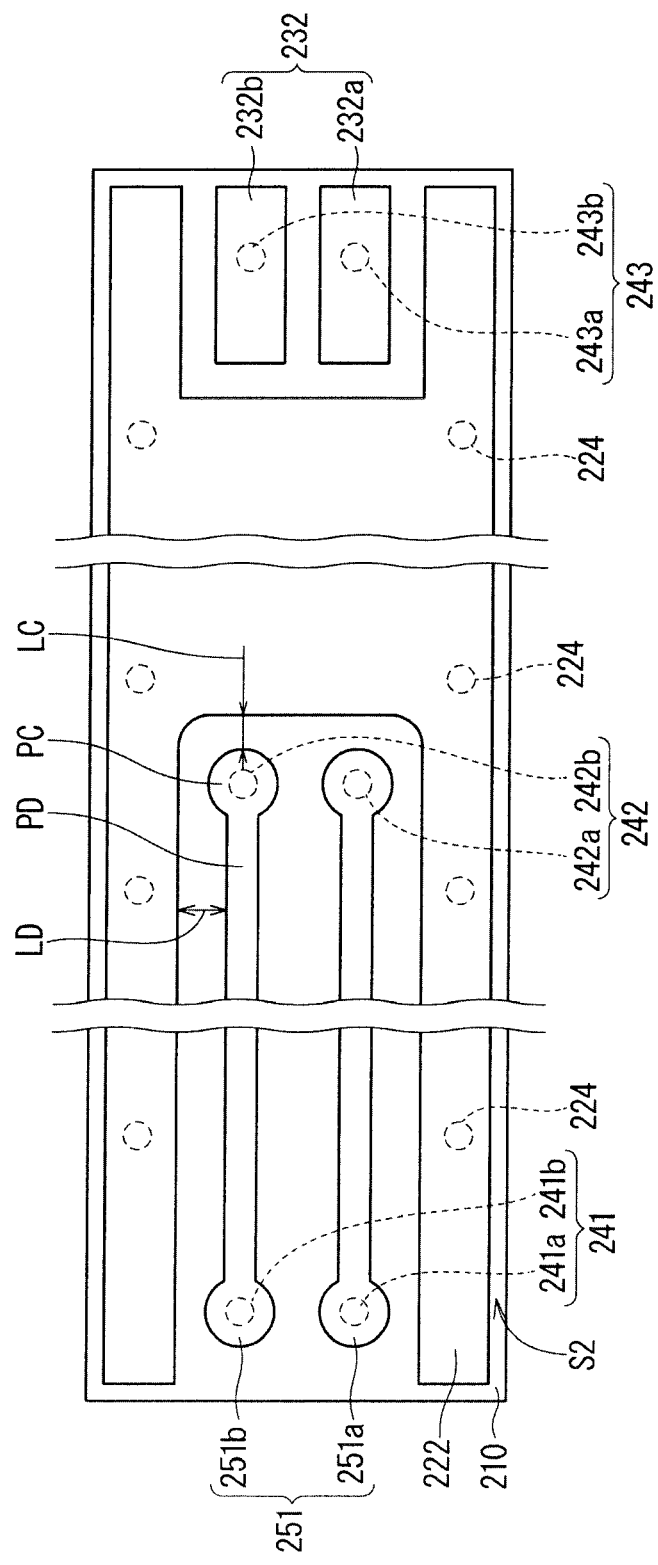
FIG. 8 is a bottom view schematically illustrating a configuration of the flexible substrate included in the electronic device illustrated in FIG. 6.

FIG. 6 is an enlarged view of a region VI illustrated in FIG. 1. FIG. 7 and FIG. 8 are a top view and a bottom view, respectively, schematically illustrating a configuration of the flexible substrate 200 (FIG. 6). The flexible substrate 200 is a substrate having high flexibility in the thickness direction (vertical direction in FIG. 6), and is bent as illustrated in FIG. 6 in a state of being attached to the PCB 770.

The flexible substrate 200 includes an insulation resin layer 210, and a plurality of conductive members attached to the insulation resin layer 210. The plurality of conductive members include a plurality of upper signal pads 231 (first signal pad), a plurality of lower signal pads 232 (second signal pad), a plurality of lower signal lines 251 (first signal line), a plurality of upper signal lines 252 (second signal line), an upper ground pattern 221 (first ground pattern), a lower ground pattern 222 (second ground pattern), a plurality of signal penetration conductive parts 241 (first penetration conductive part), a plurality of signal penetration conductive parts 242 (second penetration conductive part), a plurality of signal penetration conductive parts 243 (third penetration conductive part), and a ground penetration conductive part 224.

The insulation resin layer 210 includes an upper surface S1 (first surface) that faces the terminal surface ST of the insulation ceramic layer 110, and a lower surface S2 (second surface on the opposite side of the first surface). The upper surface S1 and the lower surface S2 are substantially in parallel to each other. In a state where the flexible substrate 200 is attached to the PCB 770, each of the upper surface S1 and the lower surface S2 is a curved surface. The insulation resin layer 210 has such high flexibility as to be able to secure flexibility that is required for the flexible substrate 200, and is made of polyimide, for example.

The upper ground pattern 221 and the lower ground pattern 222 are disposed on the upper surface S1 and the lower surface S2 of the insulation resin layer 210, respectively. The ground penetration conductive part 224 penetrates the insulation resin layer 210, and electrically connects the upper ground pattern 221 and the lower ground pattern 222 to each other.

The upper signal pads 231 are disposed on the upper surface S1 of the insulation resin layer 210. The upper signal pads 231 include an upper signal pad 231a and an upper signal pad 231b as a pair of signal pads constituting a differential line.

The signal penetration conductive parts 241 penetrate the insulation resin layer 210 from the upper signal pads 231 so as to extend to the lower surface S2 of the insulation resin layer 210. The signal penetration conductive parts 241 include a signal penetration conductive part 241*a* and a signal penetration conductive part 241*b*. The signal penetration conductive part 241*a* and the signal penetration conductive part 241*b* are connected to the upper signal pad 231*a* and the upper signal pad 231*b* on the upper surface S1, respectively.

The lower signal lines 251 are disposed on the lower surface S2 of the insulation resin layer 210. The lower signal lines 251 include a lower signal line 251*a* and a lower signal line 251*b* as a pair of signal lines constituting a differential line. The lower signal line 251*a* is connected to the upper signal pad 231*a* through the signal penetration conductive part 241*a*. The lower signal line 251*b* is connected to the upper signal pad 231*b* through the signal penetration conductive part 241*b*.

The signal penetration conductive parts 242 penetrate the insulation resin layer 210 from the lower signal lines 251 so as to extend to the upper surface S1 of the insulation resin layer 210. The signal penetration conductive parts 242 include a signal penetration conductive part 242*a* and a signal penetration conductive part 242*b*. The signal penetration conductive part 242*a* and the signal penetration conductive part 242*b* are connected to the lower signal line 251*a* and the lower signal line 251*b* on the lower surface S2, respectively.

The upper signal lines 252 are disposed on the upper surface S1 of the insulation resin layer 210 so as to be separated away from the upper signal pads 231. The upper signal lines 252 include an upper signal line 252*a* and an upper signal line 252*b* as a pair of signal lines constituting a differential line. The upper signal line 252*a* is connected to the lower signal line 251*a* through the signal penetration conductive part 242*a*. The upper signal line 252*b* is connected to the lower signal line 251*b* through the signal penetration conductive part 242*b*.

The signal penetration conductive parts 243 penetrate the insulation resin layer 210 from the upper signal lines 252 so as to extend to the lower surface S2 of the insulation resin layer 210. The signal penetration conductive parts 243 include a signal penetration conductive part 243*a* and a signal penetration conductive part 243*b*. The signal penetration conductive part 243*a* and the signal penetration conductive part 243*b* are connected to the upper signal line 252*a* and the upper signal line 252*b* on the upper surface S1, respectively.

The lower signal pads 232 are disposed on the lower surface S2 of the insulation resin layer 210 so as to be separated away from the lower signal lines 251. The lower signal pads 232 include a lower signal pad 232*a* and a lower signal pad 232*b* as a pair of signal pads constituting a differential line. The lower signal pad 232*a* is connected to the upper signal line 252*a* through the signal penetration conductive part 243*a*. The lower signal pad 232*b* is connected to the upper signal line 252*b* through the signal penetration conductive part 243*b*.

The upper signal pad 231*a* and the upper signal pad 231*b* are joined to the signal terminal 121*a* and the signal terminal 121*b* of the terminal substrate 100, respectively. The upper ground pattern 221 is joined to the ground terminal 122 of the terminal substrate 100. The lower signal pad 232*a*, the lower signal pad 232*b*, and the lower ground pattern 222 are joined to the circuit 772 of the PCB 770. The above joining may be performed using a connection member (not illustrated), such as a solder layer.

The terminal surface ST (FIG. 5) of the insulation ceramic layer 110 includes a margin region RM between the edge ED of the terminal surface ST and the signal terminal 121. Specifically, the edge ED of the terminal surface ST is separated away from the signal terminal 121. Between the margin region RM on the terminal surface ST of the insulation ceramic layer 110 and the insulation resin layer 210, a gap is formed in the thickness direction (direction perpendicular to the drawing sheet of FIG. 5, vertical direction in FIG. 6). The upper ground pattern 221 enters the gap. Thus, in plan view (FIG. 5), the upper ground pattern 221 overlaps a part of the margin region RM and the edge ED.

Each of the upper signal lines 252 (FIG. 7) includes an end portion PA connected to the signal penetration conductive part 242, and an extending portion PB extending from the end portion PA toward the signal penetration conductive part 243 It is preferable that an interval LA between the upper ground pattern 221 and the end portion PA be smaller than an interval LB between the upper ground pattern 221 and the extending portion PB. Each of the lower signal lines 251 (FIG. 8) includes an end portion PC connected to the signal penetration conductive part 242, and an extending portion PD extending from the end portion PC toward the signal penetration conductive part 241. It is preferable that an interval LC between the lower ground pattern 222 and the end portion PC be smaller than an interval LD between the lower ground pattern 222 and the extending portion PD.

Note that the surface of the flexible substrate 200 illustrated in FIG. 7 and FIG. 8 may be covered by an insulation coating layer (not illustrated) in so far as electrical connection between the flexible substrate 200 and each of the terminal substrate 100 and the PCB 770 is not interfered. Further, the number of each of the signal penetration conductive part 241*a* and the signal penetration conductive part 241*b* is one in FIG. 7 and FIG. 8; however, as a modification, the number may be two or more. With this configuration, contribution of thermal conduction by the signal penetration conductive part 241*a* and the signal penetration conductive part 241*b* can be enhanced in heating for a joining process between the upper signal pads 231 and the signal terminals 121 in manufacture of the composite wiring board 500. With this configuration, the joining process is further facilitated. Similarly, the number of each of the signal penetration conductive part 243*a* and the signal penetration conductive part 243*b* is one in FIG. 7 and FIG. 8; however, as a modification, the number may be two or more. With this configuration, contribution of thermal conduction by the signal penetration conductive part 243*a* and the signal penetration conductive part 243*b* can be enhanced in heating for a joining process between the lower signal pads 232 and the circuit 772 in manufacture of the electronic device 700. With this configuration, the joining process is further facilitated.

FIG. 9 is a cross-sectional diagram schematically illustrating a configuration of the flexible substrate 200 and the resin adhesive agent 300 taken along the line IX-IX of FIG. 6. The resin adhesive agent 300 is separated from the lower signal lines 251 by the upper ground pattern 221 in the thickness direction of the flexible substrate 200 (vertical direction in FIG. 9). In other words, the upper ground pattern 221 is disposed between the resin adhesive agent 300 and the lower signal lines 251.

Figure 10:
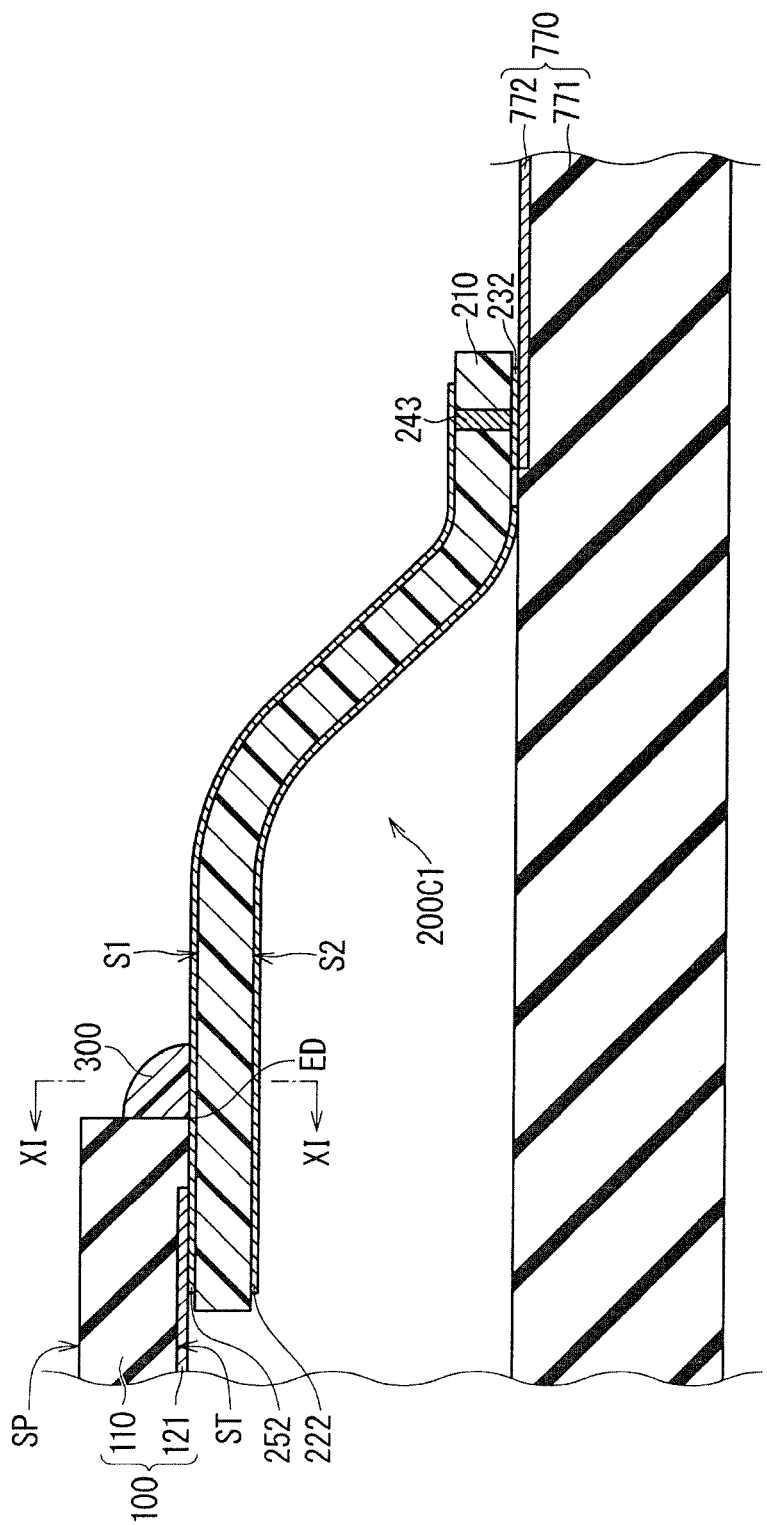
FIG. 10 is a cross-sectional diagram illustrating an electronic device according to the first comparative example, shown in a view similar to FIG. 6.
Figure 11:
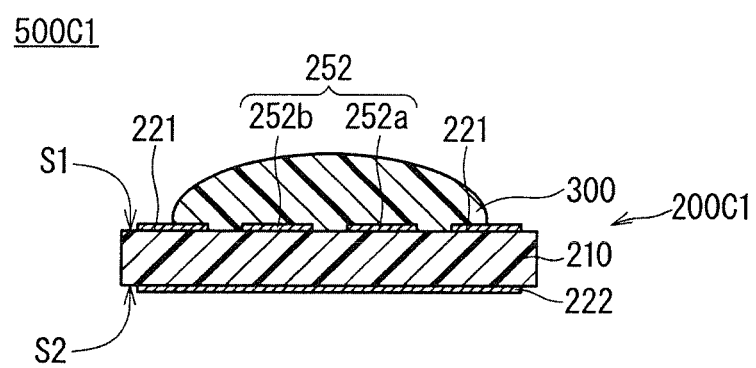
FIG. 11 is a cross-sectional diagram schematically illustrating a configuration of the flexible substrate and the resin adhesive agent taken along the line XI-XI of FIG. 10.

FIG. 10 is a cross-sectional diagram of an electronic device 700C1 according to the first comparative example, shown in a view similar to FIG. 6. FIG. 11 is a cross-sectional diagram schematically illustrating a configuration of a flexible substrate 200C1 and the resin adhesive agent 300 taken along the line XI-XI (FIG. 10). Unlike the above embodiment (FIG. 6), in the present comparative example (FIG. 10), the upper signal lines 252 extend from the top of the signal terminals 121 beyond the edge ED of the terminal surface ST in the horizontal direction (horizontal direction in FIG. 10). As a result, the resin adhesive agent 300 (FIG. 11) is disposed on the upper signal lines 252, and conductive members to be given the ground potential are not disposed between the resin adhesive agent 300 and the upper signal lines 252. Accordingly, capacitance through the resin adhesive agent 300 is formed between the upper signal line 252a and the upper signal line 252b constituting a pair of differential lines. Thus, as the first phenomenon, the capacitance varies due to variation of a formation process of the resin adhesive agent 300, which results in variation of characteristic impedance of the differential lines. As the second phenomenon, because a material of the resin adhesive agent 300 is typically a material having relatively high dielectric loss, capacitance attributable to the material is formed, which causes increase of the dielectric loss of the differential lines. From the above, in the present comparative example, it is difficult to stably form a differential line having a wideband.

Note that, in the electronic device 700C1, if the resin adhesive agent 300 is omitted, strength of fixing between the flexible substrate 200C1 and the terminal substrate 100 becomes insufficient, which makes it difficult to secure sufficient reliability. In addition, the position of the upper signal lines 252 with respect to the edge ED of the terminal surface ST is liable to be unstable, and this thus causes characteristic impedance of the differential line to be liable to vary.

Figure 12:
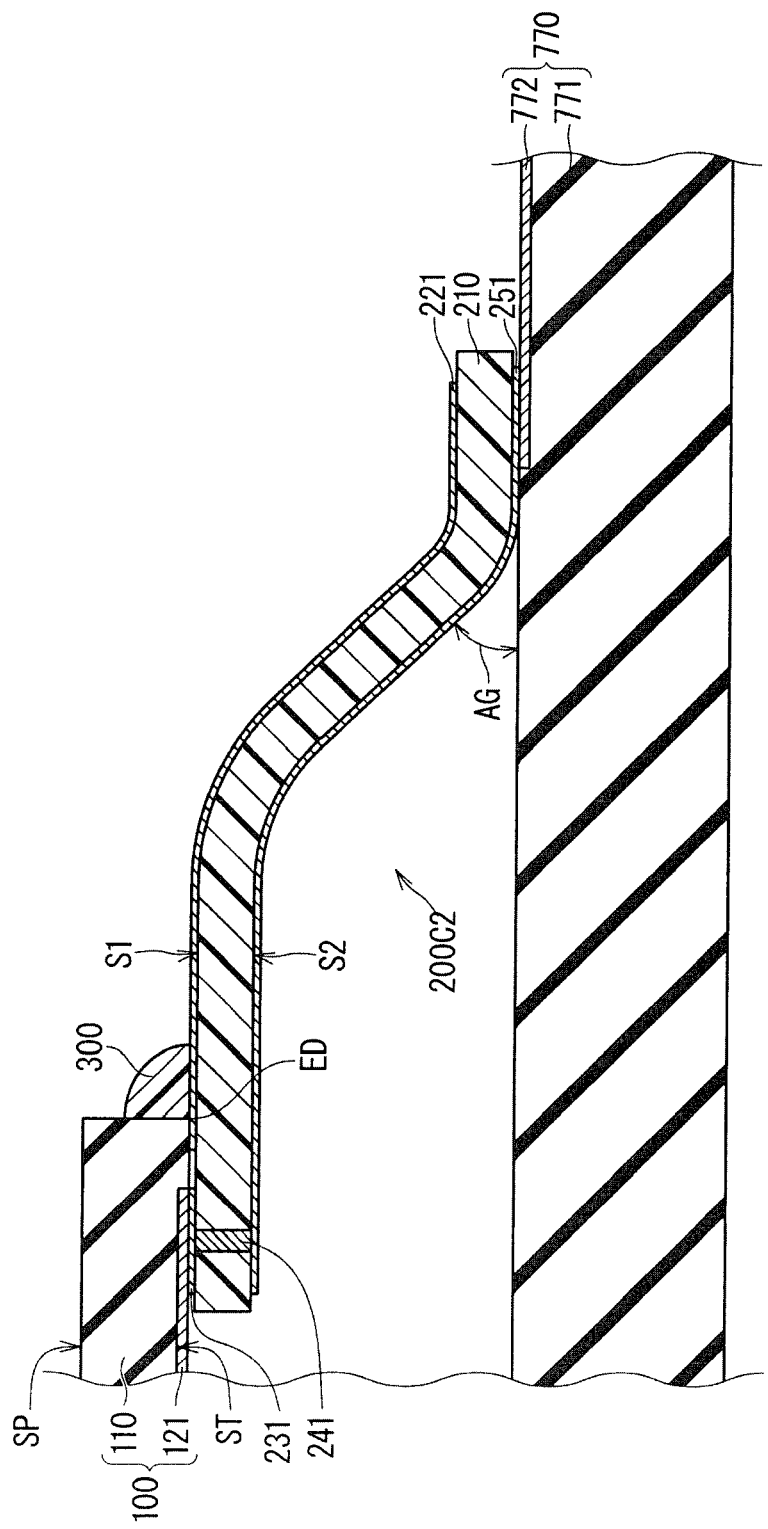
FIG. 12 is a cross-sectional diagram illustrating an electronic device according to the second comparative example, shown in a view similar to FIG. 6.

FIG. 12 is a cross-sectional diagram of an electronic device 700C2 according to the second comparative example, shown in a view similar to FIG. 6. Unlike the above embodiment (FIG. 6), in the present comparative example (FIG. 12), the lower signal lines 251 extend from the signal penetration conductive parts 241 to the top of the circuit 772 of the PCB 770 in the horizontal direction (horizontal direction in the figure). As a result, characteristic impedance of the lower signal lines 251 varies depending on relative disposition between the flexible substrate 200C2 and the PCB 770, in particular an angle AG formed between the flexible substrate 200C2 and the PCB 770. Thus, it is difficult to stably form a differential line having a wideband. Note that, if a resin adhesive agent is filled in a space having the angle AG in order to stabilize the angle AG in the electronic device 700C2, characteristic impedance of the differential line varies due to variation of the formation process of the resin adhesive agent.

According to the composite wiring board 500 (FIG. 6) of the present embodiment, the PCB 770 to be joined to the lower signal pads 232 of the flexible substrate 200 faces the lower surface S2, not the upper surface S1, of the flexible substrate 200, while the signal terminals 121 of the terminal substrate 100 face the upper surface S1 of the flexible substrate 200. In the composite wiring board 500, primarily, with a signal path of the flexible substrate 200 being guided to the lower surface S2 of the flexible substrate 200 by the signal penetration conductive parts 241, adverse influence on characteristic impedance of the signal path due to a configuration near the terminal substrate 100 faced by the upper surface S1, in particular the resin adhesive agent 300, can be reduced. Secondarily, with the signal path of the flexible substrate 200 being guided to the upper surface S1 of the flexible substrate 200 by the signal penetration conductive parts 242, adverse influence on characteristic impedance of the signal path due to a configuration near the PCB 770 faced by the lower surface S2, in particular the angle AG, can be reduced. Based on these advantages, both of the adverse influence on characteristic impedance of the signal path due to the configuration near the terminal substrate 100 faced by the upper surface S1 and the adverse influence on characteristic impedance of the signal path due to the configuration near the PCB 770 faced by the lower surface S2 can be reduced. With this configuration, characteristic impedance of the signal path of the flexible substrate 200 can be more easily maintained at a desired value. From the above, it is possible to stably enhance a bandwidth of the signal path of the flexible substrate 200 electrically joining the signal terminals 121 of the terminal substrate 100 which faces the upper surface S1 of the flexible substrate 200 and the PCB 770 which is to face the lower surface S2 of the flexible substrate 200 to each other.

The electronic device 700 (FIG. 6) according to the present embodiment includes the composite wiring board 500. With this configuration, the signal terminals 121 of the terminal substrate 100 and the circuit 772 of the PCB 770 can be electrically connected to each other by the flexible substrate 200.

Preferably, the composite wiring board 500 (FIG. 4) includes the resin adhesive agent 300 that connects the flexible substrate 200 and the side surface SS of the insulation ceramic layer 110 to each other. With this configuration, the flexible substrate 200 can be rigidly fixed to the terminal substrate 100. Here, according to the present embodiment, adverse influence on characteristic impedance of the signal path of the flexible substrate 200 due to the resin adhesive agent 300 located near the terminal substrate 100 is reduced for the reasons described above. In addition, adverse influence on dielectric loss of the signal path of the flexible substrate 200 can also be reduced.

The terminal substrate 100 (FIG. 5) includes the ground terminal 122, and the flexible substrate 200 (FIG. 6) includes the upper ground pattern 221 and the lower ground pattern 222. With this configuration, the composite wiring board 500 consisting of the terminal substrate 100 and the flexible substrate 200 can be provided with a part maintained at the ground potential. The part has an effect of shielding electric fields. By using the effect, transmission characteristics can be enhanced.

Preferably, the upper ground pattern 221 (FIG. 5) enters a gap between the margin region RM (FIG. 5) on the terminal surface ST of the insulation ceramic layer 110 and the insulation resin layer 210 in the thickness direction (direction perpendicular to the drawing sheet of FIG. 5, vertical direction in FIG. 6). With this configuration, primarily, strength of the flexible substrate 200 can be enhanced. Secondarily, entry of the resin adhesive agent 300 into the gap can be reduced in manufacture of the composite wiring board 500. With this configuration, variation of characteristic impedance of the differential line of the composite wiring board 500 due to variation of the formation process of the resin adhesive agent 300 can be reduced.

Preferably, the interval LA (FIG. 7) between the upper ground pattern 221 and the end portion PA is smaller than the interval LB (FIG. 7) between the upper ground pattern 221 and the extending portion PB. With this configuration, local increase of characteristic impedance near the end portion PA due to no formation of the lower ground pattern 222 near the end portion PA in plan layout can be at least partially cancelled out. Therefore, the signal path of the flexible substrate 200 can be caused to have a wider bandwidth. Similarly, the interval LC (FIG. 8) between the lower ground pattern 222 and the end portion PC is smaller than the interval LD (FIG. 8) between the lower ground pattern 222 and the extending portion PD. With this configuration, local increase of characteristic impedance near the end portion PC due to no formation of the upper ground pattern 221 near the end portion PC in plan layout can be at least partially cancelled out. Therefore, the signal path of the flexible substrate 200 can be caused to have a wider bandwidth.

The package 600 (FIG. 1) according to the present embodiment includes the frame part 610. With this configuration, the frame part 610 together with the terminal substrate 100 constitutes the cavity CV for accommodating the electronic component 710. In addition, an electrical path between the inside and the outside of the cavity CV can be provided by the terminal substrate 100.

Preferably, the package 600 (FIG. 1) includes the base plate 620 that promotes heat dissipation while supporting the electronic component 710. With this configuration, heat dissipation efficiency to the outside of the package 600 can be enhanced. Further, the base plate 620 faces the opposite surface SP (FIG. 3), not the terminal surface ST, of the terminal substrate 100. Thus, a heat dissipation surface (upper surface in FIG. 1) of the base plate 620 does not face the PCB 770. With this configuration, performance of heat dissipation from the base plate 620 can be enhanced. Heat dissipation performance can further be enhanced by attaching a heat dissipation fin, a water cooling mechanism, or the like to the base plate 620.

The terminal 120 (FIG. 1) to which each of the electronic component 710 and the flexible substrate 200 is electrically connected is disposed on the terminal surface ST (FIG. 3) of the insulation ceramic layer 110. With this configuration, the formation process of the signal terminals 121 (FIG. 5) of the terminal 120 can be performed as formation of conductive patterns on the terminal surface ST (typically, printing and firing of a conductive paste on the terminal surface ST). Thus, there is no need to perform overlaying of a plurality of conductive patterns in the formation process of the signal terminals 121. Note that, when such overlaying is required, characteristic impedance of the signal terminals varies due to variation of overlay accuracy.

Note that the above embodiment specifically describes the composite wiring board 500 including one differential line. However, the composite wiring board may include a plurality of differential lines.

Figure 13:
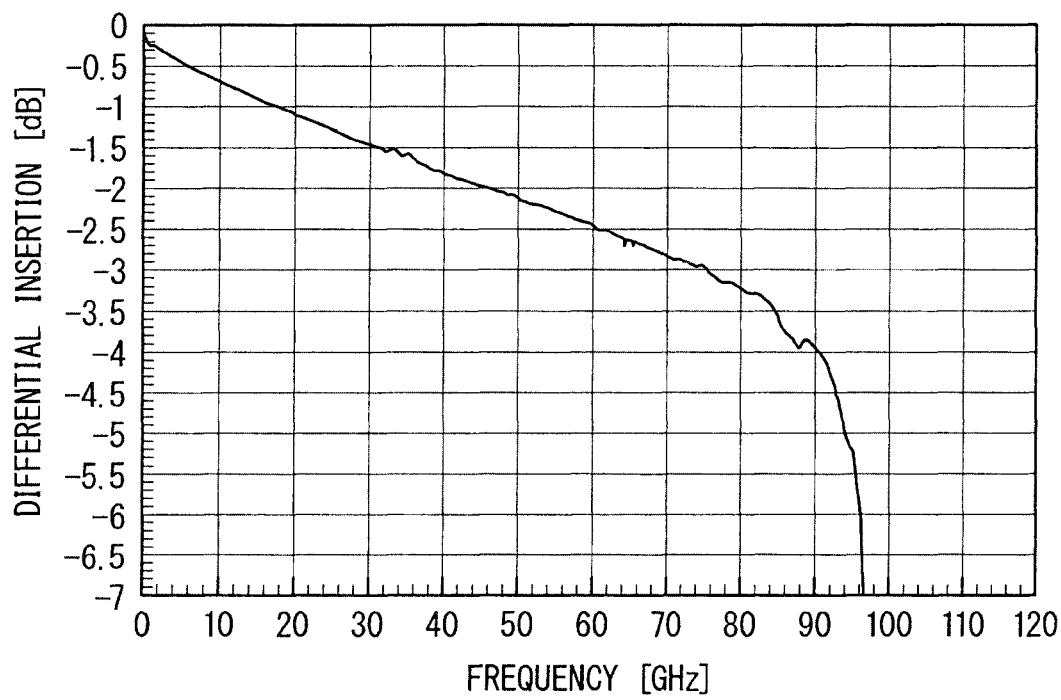
FIG. 13 is a graph showing simulation results of a relationship between frequency and differential insertion regarding the composite wiring board according to the embodiment.
Figure 14:
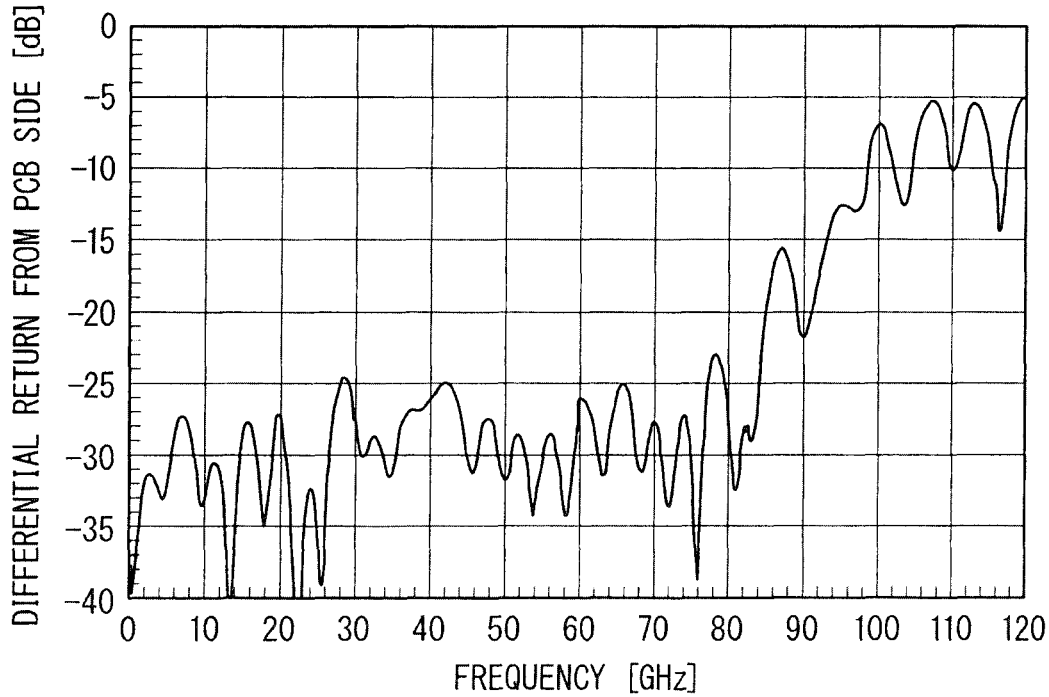
FIG. 14 is a graph showing simulation results of a relationship between frequency and differential return from a PCB side regarding the composite wiring board according to the embodiment.

FIG. 13 and FIG. 14 are graphs showing simulation results of transmission characteristics regarding the composite wiring board according to the above embodiment. Specifically, FIG. 13 shows an example of a relationship between frequency and differential insertion, and FIG. 14 shows an example of a relationship between frequency and differential return from the PCB side. Based on these results, by applying the above embodiment as appropriate, a bandwidth as wide as approximately at least 80 GHz is expected.

While the invention has been shown and described in detail, the foregoing description is in all aspects illustrative and not restrictive. It is therefore understood that numerous unillustrated modifications can be devised without departing from the scope of the present invention. For example, the above embodiment specifically describes the electronic device including the optical component in addition to the electronic component. However, the electronic device need not include the optical component.

What is claimed is:

1. A composite wiring board comprising:
   a terminal substrate, the terminal substrate including
      an insulation ceramic layer having a terminal surface having an edge, an opposite surface on an opposite side of the terminal surface, and a side surface connecting the edge of the terminal surface and the opposite surface to each other, and
      a signal terminal disposed on the terminal surface of the insulation ceramic layer; and
   a flexible substrate, the flexible substrate including
      an insulation resin layer having a first surface facing the terminal surface of the insulation ceramic layer, and a second surface on an opposite side of the first surface,
      a first signal pad disposed on the first surface of the insulation resin layer, and joined to the signal terminal of the terminal substrate,
      a first penetration conductive part penetrating the insulation resin layer from the first signal pad so as to extend to the second surface of the insulation resin layer,
      a first signal line connected to the first signal pad through the first penetration conductive part, and disposed on the second surface of the insulation resin layer,
      a second penetration conductive part penetrating the insulation resin layer from the first signal line so as to extend to the first surface of the insulation resin layer,
      a second signal line connected to the first signal line through the second penetration conductive part, and disposed on the first surface of the insulation resin layer so as to be separated away from the first signal pad,
      a third penetration conductive part penetrating the insulation resin layer from the second signal line so as to extend to the second surface of the insulation resin layer, and
      a second signal pad connected to the second signal line through the third penetration conductive part, and disposed on the second surface of insulation resin layer so as to be separated away from the first signal line;
   wherein the terminal substrate includes a ground terminal disposed on the terminal surface of the insulation ceramic layer, and
   the flexible substrate includes
      a first ground pattern disposed on the first surface of the insulation resin layer, and joined to the around terminal of the terminal substrate, and
      a second ground pattern disposed on the second surface of the insulation resin layer, and electrically connected to the first ground pattern;
   wherein the second signal line includes an end portion connected to the second penetration conductive part and an extending portion extending from the end portion toward the third penetration conductive part, and an interval between the first ground pattern and the end portion is smaller than an interval between the first ground pattern, and the extending portion.

2. The composite wiring board according to claim 1, wherein
   the terminal surface of the insulation ceramic layer includes a margin region between the edge of the terminal surface and the signal terminal, and the first ground pattern enters a gap between the margin region and the insulation resin layer.

3. A package comprising:
the composite wiring board according to claim 1; and
a frame part constituting a space for accommodating an electronic component, together with the terminal substrate.

4. The package according to claim 3, further comprising a base plate for supporting the electronic component, the base plate facing the opposite surface of the terminal substrate.

5. An electronic device comprising:
the package according to claim 4;
the electronic component supported by the base plate of the package, and electrically connected to the signal terminal of the package; and
a circuit substrate including a circuit joined to the second signal pad of the package.

6. The electronic device according to claim 5, further comprising a lid attached to the frame part for maintaining an airtight state of the space, the lid disposed on the circuit substrate.

7. The composite wiring board according to claim 1, wherein the first ground pattern is disposed between the first signal line and a resin adhesive agent connecting the flexible substrate and the side surface of the insulation ceramic layer to each other.

8. A composite wiring board comprising:
a terminal substrate, the terminal substrate including
   an insulation ceramic layer having a terminal surface having an edge, an opposite surface on an opposite side of the terminal surface, and a side surface connecting the edge of the terminal surface and the opposite surface to each other, and
   a signal terminal disposed on the terminal surface of the insulation ceramic layer; and
a flexible substrate, the flexible substrate including
   an insulation resin layer having a first surface facing the terminal surface of the insulation ceramic layer, and a second surface on an opposite side of the first surface,
   a first signal pad disposed on the first surface of the insulation resin layer, and joined to the signal terminal of the terminal substrate,
   a first penetration conductive part penetrating the insulation resin layer from the first signal pad so as to extend to the second surface of the insulation resin layer,
   a first signal line connected to the first signal pad through the first penetration conductive part, and disposed on the second surface of the insulation resin layer,
   a second penetration conductive part penetrating the insulation resin layer from the first signal line so as to extend to the first surface of the insulation resin layer,
   a second signal line connected to the first signal line through the second penetration conductive part, and disposed on the first surface of the insulation resin layer so as to be separated away from the first signal pad,
   a third penetration conductive part penetrating the insulation resin layer from the second signal line so as to extend to the second surface of the insulation resin layer, and
   a second signal pad connected to the second signal line through the third penetration conductive part, and disposed on the second surface of insulation resin layer so as to be separated away from the first signal line,
wherein the terminal substrate includes a ground terminal disposed on the terminal surface of the insulation ceramic layer, and
the flexible substrate includes
   a first ground pattern disposed on the first surface of the insulation resin layer, and joined to the ground terminal of the terminal substrate, and
   a second ground pattern disposed on the second surface of the insulation resin layer, and electrically connected to the first ground pattern,
wherein the terminal surface of the insulation ceramic layer includes a margin region between the edge of the terminal surface and the signal terminal, and the first ground pattern enters a gap between the margin region and the insulation resin layer.

9. A composite wiring board comprising:
a terminal substrate, the terminal substrate including
   an insulation ceramic layer having a terminal surface having an edge, an opposite surface on an opposite side of the terminal surface, and a side surface connecting the edge of the terminal surface and the opposite surface to each other, and
   a signal terminal disposed on the terminal surface of the insulation ceramic layer; and
a flexible substrate, the flexible substrate including
   an insulation resin layer having a first surface facing the terminal surface of the insulation ceramic layer, and a second surface on an opposite side of the first surface,
   a first signal pad disposed on the first surface of the insulation resin layer, and joined to the signal terminal of the terminal substrate,
   a first penetration conductive part penetrating the insulation resin layer from the first signal pad so as to extend to the second surface of the insulation resin layer,
   a first signal line connected to the first signal pad through the first penetration conductive part, and disposed on the second surface of the insulation resin layer,
   a second penetration conductive part penetrating the insulation resin layer from the first signal line so as to extend to the first surface of the insulation resin layer,
   a second signal line connected to the first signal line through the second penetration conductive part, and disposed on the first surface of the insulation resin layer so as to be separated away from the first signal pad,
   a third penetration conductive part penetrating the insulation resin layer from the second signal line so as to extend to the second surface of the insulation resin layer, and
   a second signal pad connected to the second signal line through the third penetration conductive part, and disposed on the second surface of insulation resin layer so as to be separated away from the first signal line,
wherein the terminal substrate includes a ground terminal disposed on the terminal surface of the insulation ceramic layer, and the flexible substrate includes
- a first ground pattern disposed on the first surface of the insulation resin layer, and joined to the ground terminal of the terminal substrate, and
- a second ground pattern disposed on the second surface of the insulation resin layer, and electrically connected to the first ground pattern, wherein the first ground pattern is disposed between the first signal line and a resin adhesive agent connecting the flexible substrate and the side surface of the insulation ceramic layer to each other.

10. An electronic device comprising:

a package comprising:

a composite wiring board comprising:

a terminal substrate, the terminal substrate including
- an insulation ceramic layer having a terminal surface having an edge, an opposite surface on an opposite side of the terminal surface, and a side surface connecting the edge of the terminal surface and the opposite surface to each other, and
- a signal terminal disposed on the terminal surface of the insulation ceramic layer; and a flexible substrate, the flexible substrate including
- an insulation resin layer having a first surface facing the terminal surface of the insulation ceramic layer, and a second surface on an opposite side of the first surface,
- a first signal pad disposed on the first surface of the insulation resin layer, and joined to the signal terminal of the terminal substrate,
- a first penetration conductive part penetrating the insulation resin layer from the first signal pad so as to extend to the second surface of the insulation resin layer,
- a first signal line connected to the first signal pad through the first penetration conductive part, and disposed on the second surface of the insulation resin layer,
- a second penetration conductive part penetrating the insulation resin layer from the first signal line so as to extend to the first surface of the insulation resin layer,
- a second signal line connected to the first signal line through the second penetration conductive part, and disposed on the first surface of the insulation resin layer so as to be separated away from the first signal pad,
- a third penetration conductive part penetrating the insulation resin layer from the second signal line so as to extend to the second surface of the insulation resin layer, and
- a second signal pad connected to the second signal line through the third penetration conductive part, and disposed on the second surface of insulation resin layer so as to be separated away from the first signal line, a frame part constituting a space for accommodating an electronic component, together with the terminal substrate, and a base plate for supporting the electronic component, the base plate facing the opposite surface of the terminal substrate;

the electronic component supported by the base plate of the package, and electrically connected to the signal terminal of the package;

a circuit substrate including a circuit joined to the second signal pad of the package; and a lid attached to the frame part for maintaining an airtight state of the space, the lid disposed on the circuit substrate.

* * * * *